(12) United States Patent
Ruzic et al.

(10) Patent No.: US 10,752,994 B2
(45) Date of Patent: Aug. 25, 2020

(54) APPARATUS AND METHOD FOR DEPOSITING A COATING ON A SUBSTRATE AT ATMOSPHERIC PRESSURE

(71) Applicant: The Board of Trustees of the University of Illinois, Urbana, IL (US)

(72) Inventors: David N. Ruzic, Pesotum, IL (US); Yuilun Wu, Urbana, IL (US); Ivan Shchelkanov, Champaign, IL (US); Jungmi Hong, Carlingford (AU); Zihao Ouyang, Milpitas, CA (US); Tae Seung Cho, San Jose, CA (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 16/198,002

(22) Filed: Nov. 21, 2018

(65) Prior Publication Data
US 2019/0093229 A1 Mar. 28, 2019

Related U.S. Application Data

(62) Division of application No. 14/657,327, filed on Mar. 13, 2015, now Pat. No. 10,167,556.
(Continued)

(51) Int. Cl.
| | |
|---|---|
| *C23C 2/00* | (2006.01) |
| *C23C 16/517* | (2006.01) |
| *C23C 14/00* | (2006.01) |
| *C23C 14/22* | (2006.01) |
| *C23C 14/32* | (2006.01) |

(Continued)

(52) U.S. Cl.
CPC ........ *C23C 16/517* (2013.01); *C23C 14/0021* (2013.01); *C23C 14/228* (2013.01); *C23C 14/32* (2013.01); *H05H 1/30* (2013.01); *H05H 1/46* (2013.01); *H05H 1/48* (2013.01); *H05H 2001/463* (2013.01)

(58) Field of Classification Search
USPC ................ 219/121.36–121.86; 118/715–733
See application file for complete search history.

(56) References Cited

U.S. PATENT DOCUMENTS

| | | | | |
|---|---|---|---|---|
| 4,611,108 A | * | 9/1986 | Leprince | .................. H05H 1/30 219/121.48 |
| 5,108,535 A | * | 4/1992 | Ono | ........................ H05H 1/46 118/723 IR |

(Continued)

OTHER PUBLICATIONS

Fauchais, P., Topical Review—"Understanding Plasma Spraying," *J. Phys. D: Appl. Phys.*, 37 (2004) pp. 86-108.
(Continued)

*Primary Examiner* — Rakesh K Dhingra
(74) *Attorney, Agent, or Firm* — Brinks Gilson & Lione

(57) ABSTRACT

An apparatus for depositing a coating on a substrate at atmospheric pressure comprises (a) a plasma torch comprising a microwave source coupled to an antenna disposed within a chamber having an open end, the chamber comprising a gas inlet for flow of a gas over the antenna to generate a plasma jet; (b) a substrate positioned outside the open end of the chamber a predetermined distance away from a tip of the antenna; and (c) a target material to be coated on the substrate disposed at the tip of the antenna.

12 Claims, 9 Drawing Sheets

Related U.S. Application Data

(60) Provisional application No. 61/953,072, filed on Mar. 14, 2014.

(51) Int. Cl.
   *H05H 1/30* (2006.01)
   *H05H 1/46* (2006.01)
   *H05H 1/48* (2006.01)

(56) References Cited

U.S. PATENT DOCUMENTS

| | | | |
|---|---|---|---|
| 6,899,054 B1 * | 5/2005 | Bardos | C23C 16/517 118/723 E |
| 7,964,247 B2 | 6/2011 | Boulos et al. | |
| 2004/0265507 A1 | 12/2004 | Xiong et al. | |
| 2005/0153069 A1 | 7/2005 | Tapphorn et al. | |
| 2005/0199486 A1 * | 9/2005 | Doan | B23K 11/11 204/192.38 |
| 2007/0110915 A1 | 5/2007 | Kitamura et al. | |
| 2007/0210038 A1 * | 9/2007 | Fujii | H05H 1/46 219/121.48 |
| 2011/0151270 A1 | 6/2011 | Rockstroh et al. | |

OTHER PUBLICATIONS

Gu-S. et al., "Investigation of Atmospheric Pressure CVD-Produced Aluminum Coatings for the Protection of Steel from Corrosion," *Chemical Vapor Deposition*, 16, (2010) (Abstract Only).

Harder, B.J. and Zhu, D. (2011) Plasma Spray-Physical Vapor Deposition (PS-PVD) of Ceramics for Protective Coatings, in Advanced Ceramic Coatings and Materials for Extreme Environments: Ceramic Engineering and Science Proceedings, vol. 32 (eds D. Zhu, H.-T. Lin, Y. Zhou, S. Widjaja and D. Singh), *John Wiley & Sons, Inc.* Hoboken, NJ, USA. doi: 10. 1002/9781118095232.ch7.

Liu, R.,—A Dissertation—"Fabrication and Property Study of Plasma Sprayed Alumina Coatings and Magnetron Sputtered Multilayers," B.S., Nanjing University of Aeronautics and Astronautics, May 2011, pp. 1-106.

Ouyang, Z.et al., "Laser-Assisted Plasma Coating at Atmospheric Pressure: Production of Yttria-Stabilized Zirconia Thermal Barriers," *J. Phys. D: Appl. Phys.* 44 (2011) pp. 265202-1-5.

Shahien, M. et al., "In Situ Fabrication of AlN Coating by Reactive Plasma Spraying of Al/AlN Powder," *Coatings* (2011) pp. 88-107.

Yamada, M. et al., "Fabrication of Aluminum Nitride Coating by Atmospheric Plasma Spray," *The Proceedings of the 19th International Symposium on Plasma Chemistry (ISPC 19)* Jul. 26-31, 2009, at Bochum, Germany, vol. USB pp. 1-4.

* cited by examiner

APPARATUS AND METHOD FOR DEPOSITING A COATING ON A SUBSTRATE AT ATMOSPHERIC PRESSURE

RELATED APPLICATION

The present patent document is a division of U.S. patent application Ser. No. 14/657,327, filed Mar. 13, 2015, which claims the benefit of priority under 35 U.S.C. § 119(e) to U.S. Provisional Patent Application No. 61/953,072, filed on Mar. 14, 2014, both of which are hereby incorporated by reference in their entirety.

TECHNICAL FIELD

The present disclosure is related generally to vapor deposition and more particularly to forming coatings at atmospheric pressure.

BACKGROUND

Low-pressure plasmas (LPPs) have been widely investigated and have found a number of applications in semiconductor manufacturing and processing. A relatively large and uniform plasma has to be sustained and confined in a vacuum system in order to achieve a uniform processing rate across the whole chamber. The benefit of LPP is that it requires a low breakdown voltage to ignite and has a relatively high electron temperature and low neutral temperature. However, a vacuum system is required to generate a plasma in a low pressure environment. Vacuum systems, including the chamber, pumps and other related components inside the chamber, can be expensive and difficult to adapt to changes in application requirements. Semiconductor processes, such as plasma etching and plasma deposition, can also create contamination in the vacuum chamber that may require constant cleaning, repair and maintenance.

Evaporation has also been widely used to make coatings on materials. A typical evaporator uses a small electron beam to heat the surface of the material which is to be used as the coating until it evaporates. Simply heating a crucible is another way of raising the temperature high enough such that sufficient material enters the vapor phase. These techniques also require a vacuum system since the electron beam, and more importantly the evaporated vapor, would otherwise have so many collisions in the background gas that they could not reach their intended targets.

Atmospheric pressure plasmas can be categorized into several types, according to the configuration. First is the corona discharge, which is usually ignited by applying a DC voltage (~10 kV) between a point electrode and a plane electrode. The distance is at the scale of several mm, and the current is usually kept low (<300 µA) to prevent arcing. The second is the dielectric barrier discharge (DBD), which is usually generated between two metal electrodes, where one or both are coated with a dielectric layer and may have a spacing of several millimeters. Generation of DBDs in general requires a 10 to 20 kV DC voltage, and the plasma can be spread relatively evenly in a large area. Finally, there is the atmospheric pressure plasma jet (APPJ). It may include two concentric electrodes, where the inner one may be applied with a 13.56 MHz RF power or a 2.45 GHz microwave power. Gases with adjustable rates are introduced between the two electrodes during the discharge. The ignition condition for an APPJ can be easily achieved, and the discharge of an APPJ may be homogenous, volumetric and low in gas temperature. However, sustaining a gas discharge at atmospheric pressure may be more difficult than in a vacuum chamber, since time constants for instabilities decrease with increasing pressure. A simple approach to generate large-volume atmospheric-pressure plasmas may be to create a large electric field around the cathode boundary region to supply sufficient production of electrons, which may depend on the specific structure of the electrodes and type of feed gas.

A comparison of the breakdown voltage and electron density of different atmospheric-pressure plasmas and low-pressure plasmas are listed in Table 1. It can be seen that APPJs have similar breakdown voltage to the low pressure discharges, which can be one to three orders of magnitude lower than the other atmospheric-pressure discharges. At the same time, the electron densities of APPJs are also in the same range of low-pressure discharges, but lower than the rest of atmospheric pressure discharges.

TABLE 1

Breakdown voltage and electron density of plasma discharges.

| Plasma Source | Breakdown voltage (kV) | Electron density (cm$^{-3}$) |
| --- | --- | --- |
| Low pressure discharge | 0.2-0.8 | $10^8$-$10^{13}$ |
| Arc | 10-50 | $10^{16}$-$10^{19}$ |
| Corona | 10-50 | $10^9$-$10^{13}$ |
| DBD | 5-25 | $10^{12}$-$10^{15}$ |
| APPJ | 0.05-0.2 | $10^{11}$-$10^{12}$ |

BRIEF SUMMARY

An apparatus for depositing a coating on a substrate at atmospheric pressure comprises (a) a plasma torch comprising a microwave source coupled to an antenna disposed within a chamber having an open end, the chamber comprising a gas inlet for flow of a gas over the antenna to generate a plasma jet; (b) a substrate positioned outside the open end of the chamber a predetermined distance away from a tip of the antenna; and (c) a target material to be coated on the substrate disposed at the tip of the antenna.

A method of depositing a coating on a substrate at atmospheric pressure comprises immersing a target material within a microwave plasma jet at atmospheric pressure; removing atoms from the target material, the atoms being transported from the target material to a substrate by the microwave plasma jet; and forming a coating on the substrate.

DETAILED DESCRIPTION

Figure 1A:
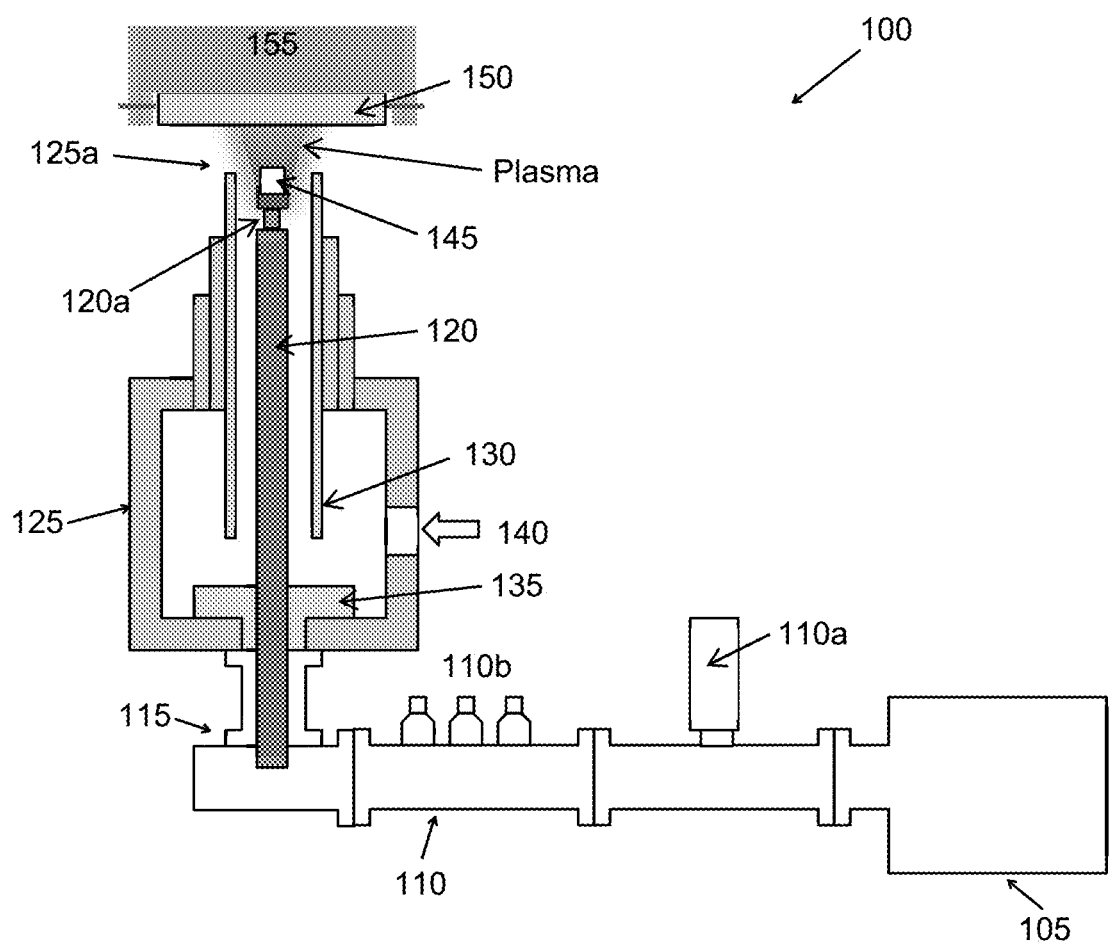
FIGS. 1A-1E show schematics of various embodiments of an atmospheric pressure plasma torch (APPT) powered by a microwave generator for evaporative coating at atmospheric pressure (ECAP).

For the first time, thin films having a controlled microstructure have been created by a microwave-powered plasma jet under atmospheric pressure conditions. The basic principle behind this technique, which may be referred to as evaporative coating at atmospheric pressure (ECAP), is to use heat from a plasma to melt and evaporate a target comprising a source material (e.g., metal) at the tip of an antenna where the plasma is generated at atmospheric pressure. Vaporized atoms are carried by a gas flow (e.g., He and $N_2$ or Ar) in the plasma towards a substrate surface, where they deposit and adhere atom-by-atom or cluster-by-cluster. If the deposited atoms or clusters (e.g., nanocrystals) comprise a reactive material such as a metal, the atoms or clusters may be oxidized by atmospheric oxygen to form metal oxide coatings, or by other gases to create other compounds (e.g., by nitrogen to make metal nitrides).

Among the benefits of this technology are that the phase and morphology of the deposited material may be modified by changing the plasma conditions. Also, since the process takes place at atmospheric pressure, no expensive vacuum chamber or vacuum equipment is needed, and high deposition rates can be achieved. Additionally, the process can be used for deposition on non-planar surfaces by moving the substrate with respect to the plasma torch, or by moving the torch at the end of a 5-axis robot to coat a complicated shape in the field.

As shown in FIGS. 1A-1E, an apparatus for depositing a coating on a substrate at atmospheric pressure includes: a plasma torch 100 comprising a microwave source 105 coupled to an antenna 120 disposed within a chamber 125 having an open end 125a, where the chamber 125 comprises a gas inlet 140 for flow of a gas over the antenna 120 to generate a plasma jet. A substrate 150 is positioned outside the open end 125a of the chamber 125 a predetermined distance away from a tip of the antenna 120, and a target material 145 to be coated on the substrate 150 is disposed at the tip of the antenna 120.

Referring to FIG. 1A, the plasma torch 100 is powered by a microwave source 105, such as a 2.45 GHz microwave generator available from Cober Electronics, Inc. (Model S64). Microwaves are generated by a magnetron supplied with a 12 kW power input and having an output that varies from approximately 0.5 to 6 kW into a matched load with continuously adjustable power. A waveguide 110 such as the WR 284 waveguide cavity is used to transmit microwave power from the magnetron 105 to the atmospheric torch 100. A coaxial adapter 115 is used to couple the microwave from the waveguide 110 into the antenna 120 of the plasma torch 100.

Figure 2:
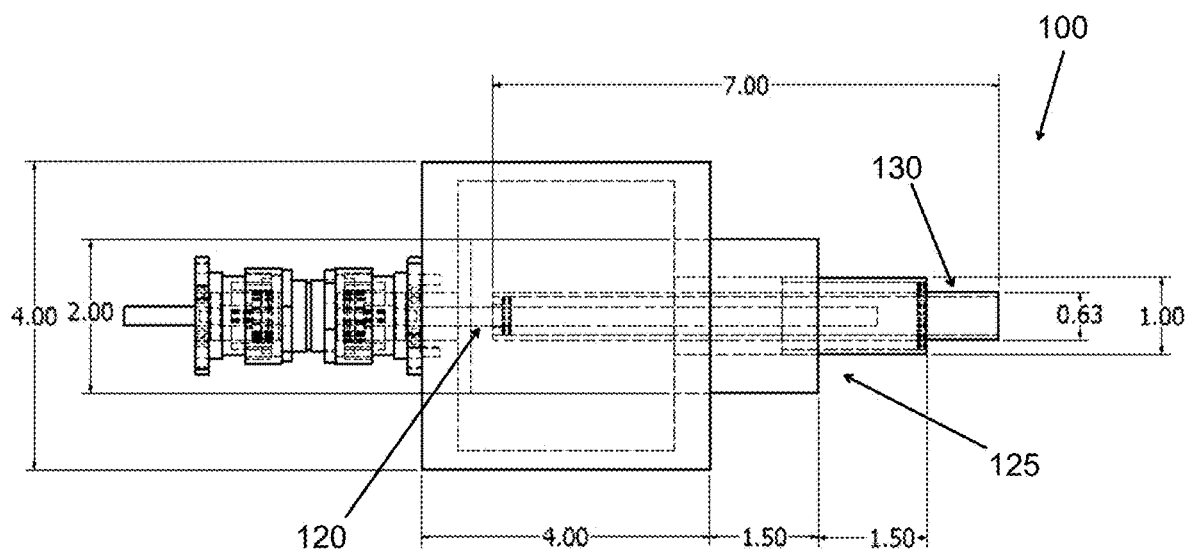
FIG. 2 shows a more detailed schematic of the plasma torch shown in FIG. 1A, where the dimensions are shown in inches.

The plasma torch 100 may have a coaxial cylinder design with a decreasing diameter near the top of the torch, as can be seen in FIG. 1A. The chamber or resonator body 125 may be made from copper, and the antenna 120 may be fabricated from tungsten and connected to the coaxial adapter 115 by, for example, a receptacle jack made by Huber & Suhner Group, USA and a 7/16 DIN adapter by RF Parts Company, USA. A gas may be fed into the APPT 100 from a gas inlet 140 near the bottom of the resonator body 125, which may be grounded. A Teflon pad 135 may be placed at the base of the wall of the outermost cylinder wall in order to prevent arcing between the antenna 120 and the copper chamber 125. A more detailed schematic of one embodiment of the plasma torch 100 of FIG. 1A is shown in FIG. 2, with dimensions shown in inches.

The antenna 120 may have a neck or taper 120a near the top to reduce heat loss to the base of the antenna 120. The antenna 120 may be ¼ inch in diameter and 6¼ inches in length, or, more generally, from about 1/64 inch (0.4 mm) to about 2 inches (50.8 mm) in diameter and may have a length that depends on the height of the chamber, which may range from about 2.5 inches (63.5 mm) to about 25 inches (635 mm). A target material 145 may be positioned at the tip of the antenna 120. The torch 100 may include a quartz discharge tube 130 surrounding the antenna 120 and defining a pathway for gas flow over the antenna 120. In one example, the quartz discharge tube may have an outer diameter of 16.2 mm and an inner diameter of 13 mm (Technical Glass Products, Inc., USA). The quartz discharge tube 130 may be fixed within the torch 100 by two Teflon rings disposed between the discharge tube 130 and the copper cylinders 125. A substrate 150 that may be in a substrate holder 155 is placed a short distance away from the torch 100 for deposition of the coating. For example, the substrate 150 is typically spaced apart from the tip of the antenna and/or the target material by about 1/32 inch (0.8 mm) to about 2 inches (50.8 mm).

The microwave waveguide 110 may include five primary sections: (1) an aluminum 90° E-bend or H-bend, depending on the experimental requirements, to change the direction of the microwave propagation from vertical to parallel; (2) a two-port circulator with an embedded water load to ensure that the reflected microwave is absorbed in the water load instead of traveling back to the magnetron; (3) a dual directional coupler 110a, which may have a 60 dB power attenuation at both ports for detecting forward and reflected microwave power respectively; (4) a 3-stub or 4-stub tuning system 110b, which can continuously adjust the reflected microwave power by inserting or extracting one or more tuning stubs in order to change the impedance matching and keep the reflected microwave power to less than 5% of the output power; and (5) a coaxial adapter 115 (e.g., a WR 284 to 7/16 coaxial adapter), which couples the microwave from the waveguide cavity into the antenna of the plasma torch. The aluminum E-bend, H-bend, two-port circulator, dual directional coupler, 4-stub tuning system may be obtained from CoberMuegge LLC, USA, while the 3-stub tuning system and the WR284 to 7/16 adapter used in the exemplary apparatus were custom made at the University of Illinois at Urbana-Champaign.

Figure 1B:
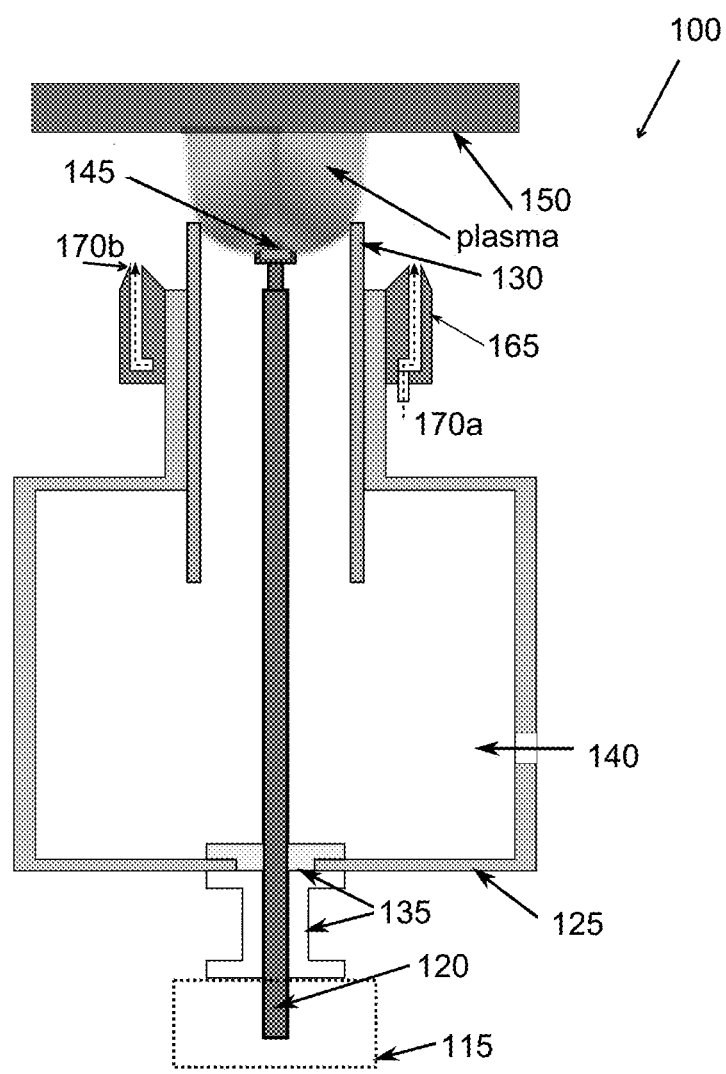

Several alternative embodiments of the atmospheric pressure plasma torch (APPT) are shown in FIGS. 1B-1E. During the ECAP process, a gas shield or curtain may be formed to help prevent oxidation of the evaporated material as it travels to the substrate. To generate the gas shield during operation of the plasma torch 100, a cylindrical nozzle 165 may be positioned radially outside the quartz tube 130 to direct a nonreactive gas into a region surrounding the plasma 160, as shown in FIG. 1B. The nozzle 165 includes a gas inlet 170a and an annular outlet 170b to direct exiting gas to the substrate 150. The nozzle 165 may have a length selected to position the outlet 170b of the nozzle 165 at the desired distance from the substrate 150.

Figure 1C:
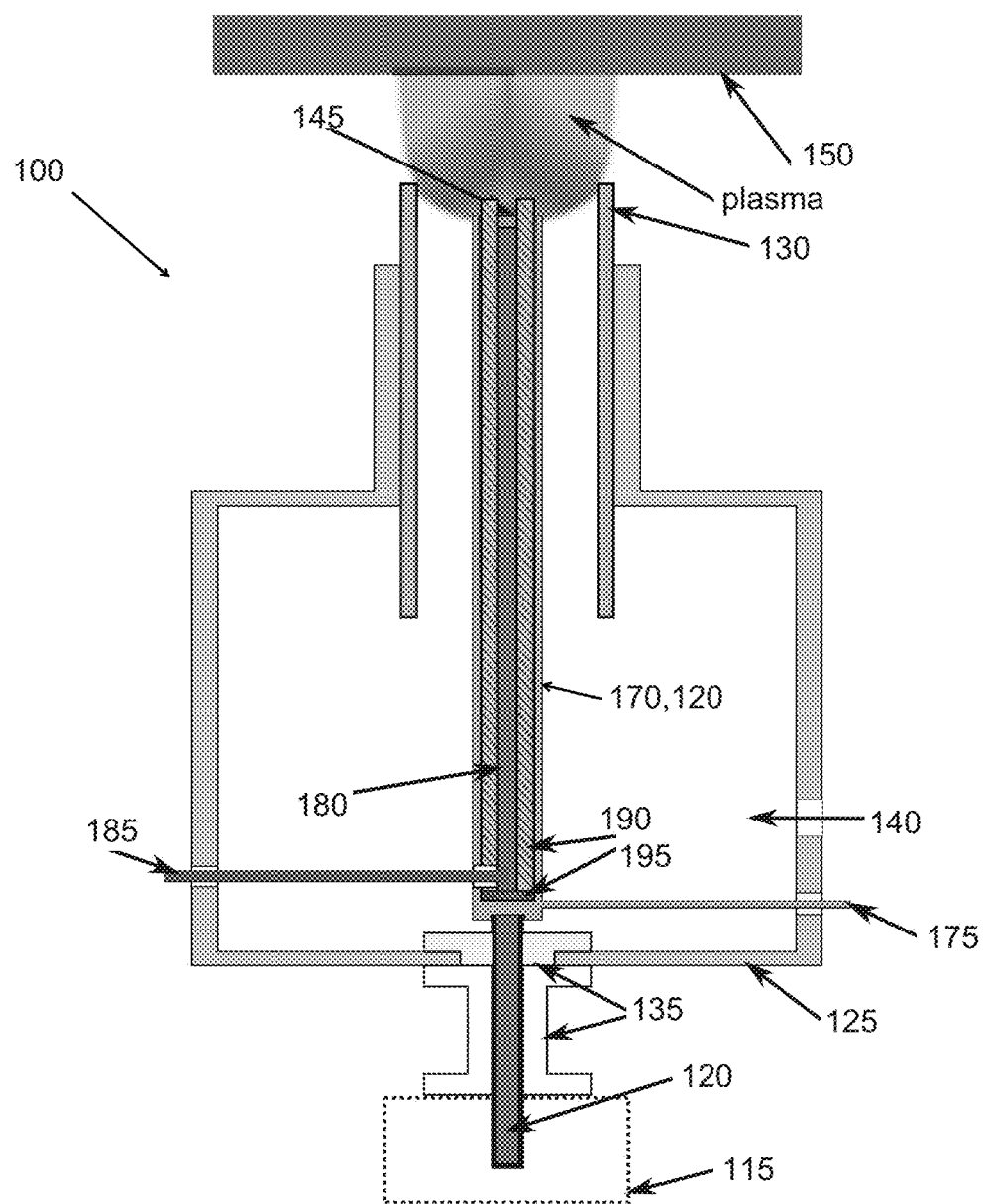

FIG. 1C shows an embodiment of the APPT in which an arc source is added to the apparatus to provide additional heating of the target material and decouple the temperature needed for evaporation of the target from the temperature of the plasma. The plasma torch 100 includes a first arc power input 175 for an external electrode 170 and a second arc power input 185 for an internal electrode 180 separated from the external electrode 170 by a ceramic tube 190. A ceramic disk 195 electrically isolates the internal electrode 180 from the first arc power input 175. The other components of the apparatus 100 are as described above. In use, an arc discharge may be generated between the internal and external electrodes 170,180 prior to igniting the plasma. For example, a voltage of from about 10 V to 60 V and a current of 5 A to 250 A may be used to power the arc source. The external electrode 170 is in electrical contact with the antenna 120 and thus also functions as the antenna 120, the antenna having the tip at which the target material is disposed.

Figure 1D:
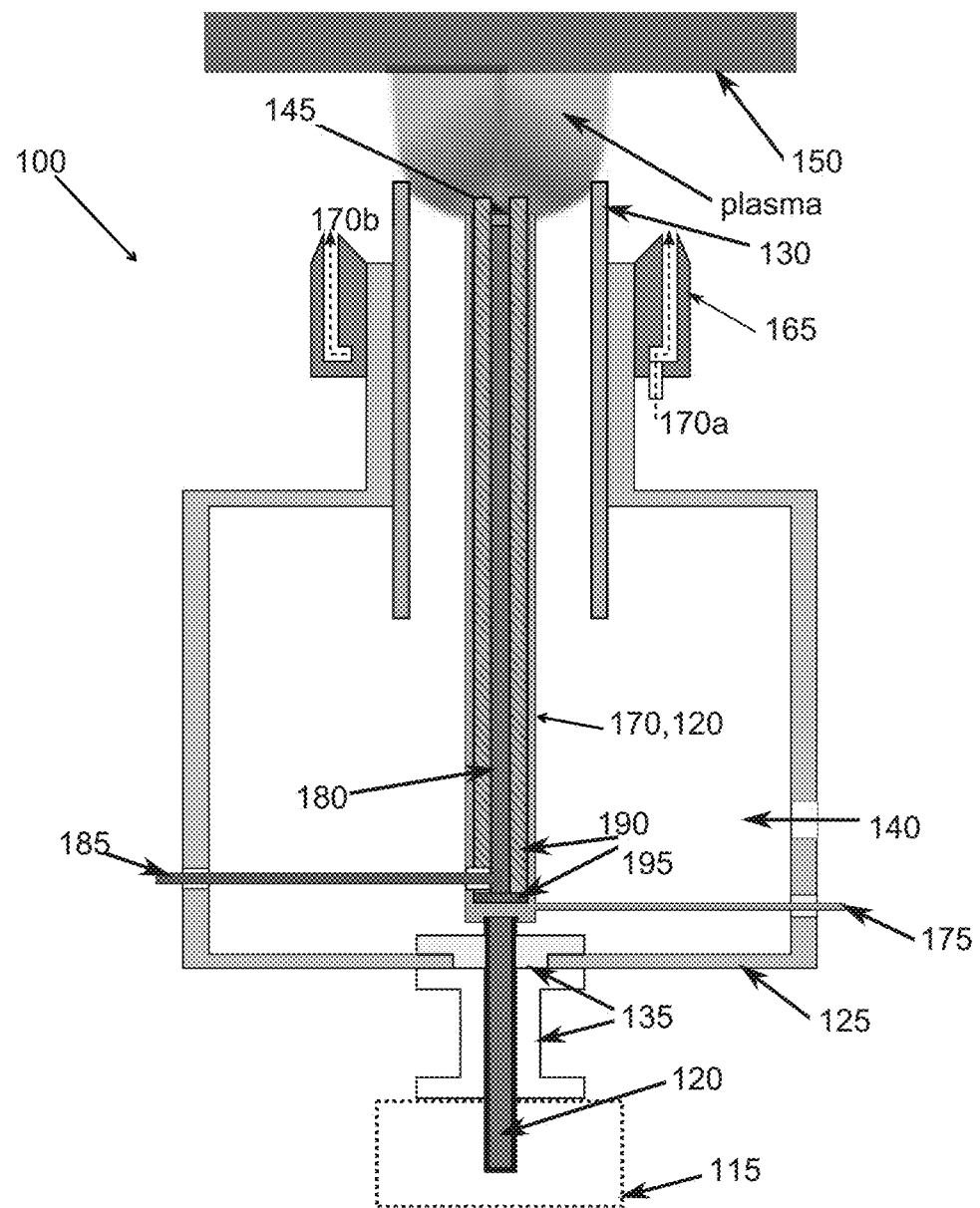
Figure 1E:
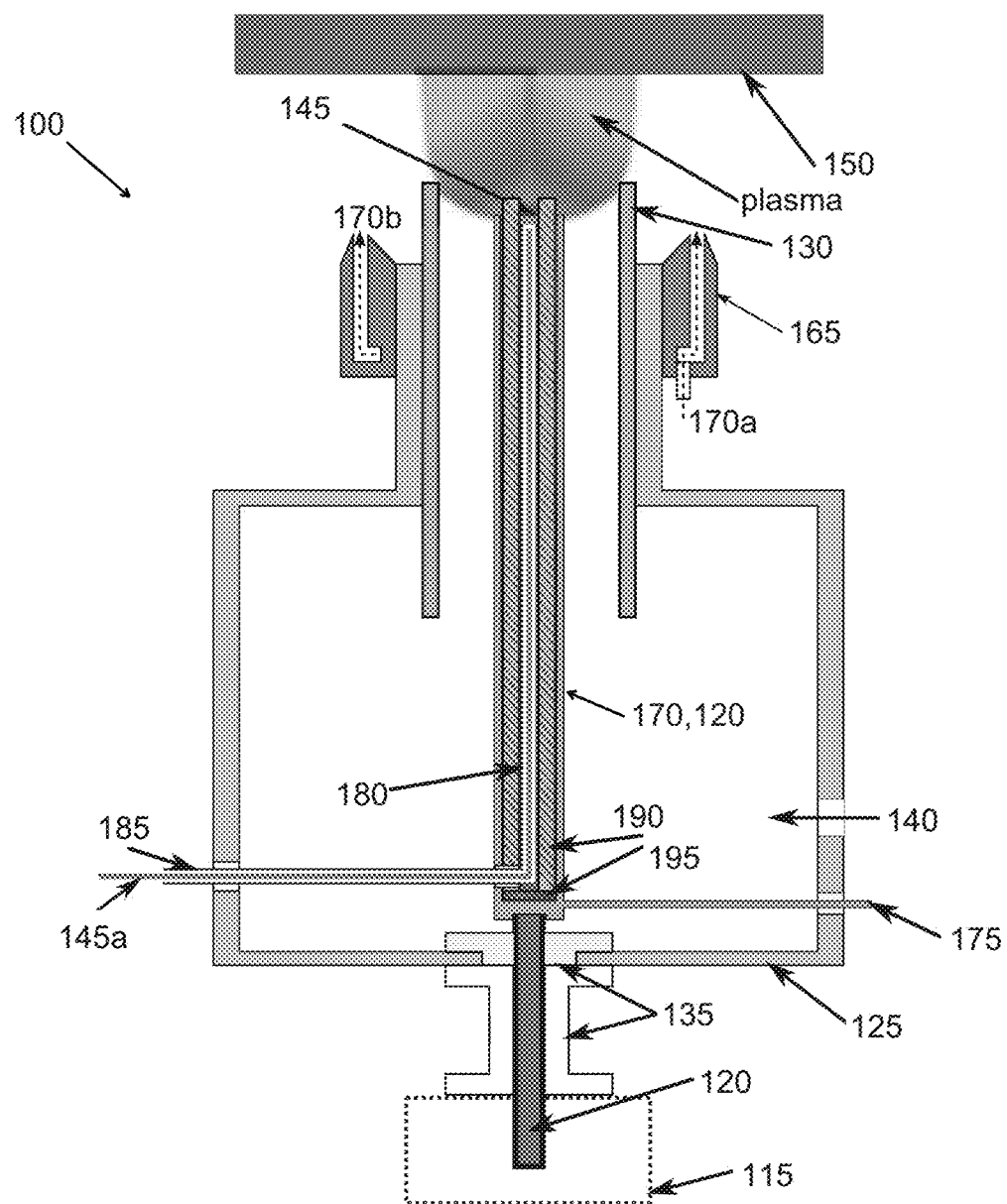

FIG. 1D shows an embodiment of the APPT that combines the plasma torch 100 with a nozzle 165 for generating the gas shield and an arc source including internal and external electrodes 170,180 and respective power inputs 175,185, as shown. FIG. 1E shows an embodiment of the APPT that includes a continuous feed of the target material 145a through a hollow core of the antenna 120. In this embodiment, the target material 145a may take the form of a wire, powders, a series of pellets, or a melt. The continuous feed of the target material 145a may be incorporated into any of the embodiments of the APPT described above.

The APPT described herein can generate an atmospheric pressure plasma having a plasma gas temperature ranging from room temperature to a maximum of about 3000° C., depending on the applied power, gas flow rate and the type of processing gases introduced. Using helium, the plasma typically can self-ignite to generate an atmospheric pressure plasma with a gas flow of between 10-30 liters per minute (LPM). If desired, an igniter can be placed on the tip of the antenna to facilitate plasma ignition. The igniter may comprise a sharp metal wire (usually tungsten or copper) with a ceramic insulator break. A plasma based on argon, nitrogen or air may be obtained by first igniting a helium plasma, then mixing one or more of the desired gases into the helium gas flow, and then slowly turning off the flow of helium gas. The ECAP process may take place for a time duration of between about 1 minute and tens of hours.

Each of the processing gases (e.g., helium, argon, nitrogen, oxygen, hydrogen, etc.) may be controlled using a flow meter, such as a RMA-Master flow meter made by Dwyze Instruments, Inc., USA. The flow meters can be individually controlled in order to produce different gas mixtures to generate different types of plasma. In the examples described here, helium and nitrogen are used primarily to create the plasma profile and gas temperature employed for the evaporation and deposition process. However, any inert gas (e.g., He, Ar, Ne, etc.) may be suitable if it is desired to produce a coating having substantially the same composition as the target material. It is also contemplated that a reactive gas may be used to generate the plasma jet (either instead of or in addition to the inert gas) in order to form an oxide or nitride coating, for example, from the target material.

Typically, a target material having a boiling (evaporation) point at or below the temperature achieved by the plasma is employed. The target material may comprise a metal such as: Al, Au, Sn, Ag, Fe, Ti, and/or others that have a melting point below tungsten. In the examples described here, a 99.99%+ pure aluminum target obtained from Kurt J. Lesker Co. is used. It is thus preferred that the target material has a purity of at least about 99.9%, at least about 99.99%, or at least about 99.999%. The target may take the form of a monolithic solid body of material, or it may comprise pellets or particles of the material. For example, the target may take the form of cylindrical aluminum pellets of ⅛ inch (3.2 mm) in diameter and ⅛ inch (3.2 mm) in height. Aluminum pellets having a high purity are preferred, since the deposition rate of aluminum oxide decreases as the impurity level of the target increases. In tests of 1000 series aluminum alloy (99% pure aluminum) pellets, the deposition rates were close to negligible.

Figure 3:
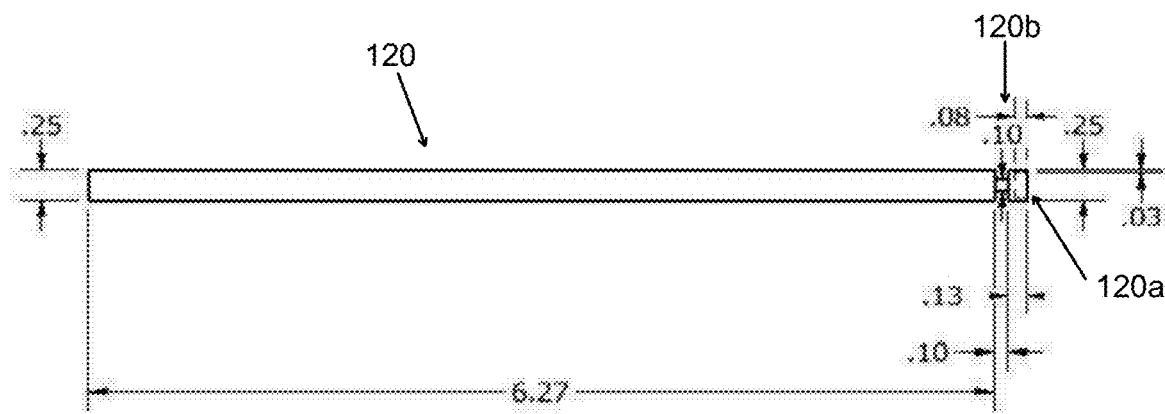
FIG. 3 shows a more detailed schematic of the antenna shown in FIG. 1A, wherein the dimensions are shown in inches.

An exemplary antenna 120 for the APPT is shown in greater detail in FIG. 3. In this example, the antenna is fabricated from 99.95% pure tungsten with a diameter of ¼ inch (6.4 mm), and about 6.5 inches (165 mm) total in length. The antenna may include a cup or recess 120a at one end to support the target material. Referring to FIG. 3, the cup 120a in the exemplary antenna 120 shown in the figure is about 0.08 inch (2.0 mm) in depth and 0.2 inch (5.1 mm) in diameter. The diameter of the cup 120a is made slightly larger than the size of the target material to accommodate molten material during and after the evaporation and coating process, so that overflows at the antenna tip may be avoided. The antenna 120 may also include a bottleneck 120b to reduce the thermal conductivity and thus heat loss from the tip, where the plasma is generated, to the base of the antenna 120. In the exemplary antenna 120 of FIG. 3, the bottleneck 120b is constructed about ⅛ inch (3.2 mm) below the tip of the tungsten antenna 120, where the diameter of the antenna 120 is reduced from about ¼ inch (6.4 mm) to about 0.1 inch (2.5 mm) over a length of about 0.1 inch (2.5 mm).

According to Fourier's law: $dQ/dt = -UA\Delta T$, where $dQ/dt$ is the amount of heat transferred per unit time in W, U is the conductance in $W/m^2K$, A is the cross-sectional area in square meters and $\Delta T$ is the temperature difference between the two ends in Kelvin. By reducing the diameter of the antenna from 0.25 inch (6.4 mm) to 0.1 inch (2.5 mm) at the neck, the heat lost through the antenna is reduced by about 84% $(1-(0.1/0.25)^2)$. This design can effectively increase the target temperature with the same input power, or achieve the same target temperature with a lower input power, thereby increasing process efficiencies and reducing microwave leakage. An insulating material such as zirconium oxide may also be placed in between the target and the antenna to further insulate the target and reduce heat lost to the antenna.

Advantageously, the substrate 150 used for deposition of the coating can sustain high gas temperatures and remain chemically inert. For example, the substrate may comprise a metal or alloy, such as 304 stainless steel. The substrate may be machined to the desired size and mounted onto a substrate support or mount. It is also contemplated that lower temperature materials may be employed for the substrate, such as polymers or paper. In examples carried out here, the substrate is chosen to be about 1 inch (25.4 mm) in diameter to provide a large surface area for coating yet easily fit into various stage holders for thin-film characterization, such as scanning electron microscopy (SEM), x-ray diffraction (XRD), and x-ray photoelectron spectroscopy (XPS). However, the substrate may have any desired size ranging from about 10 mm in diameter to many meters, if the substrate is continuously moving with respect to the torch.

Figure 4:
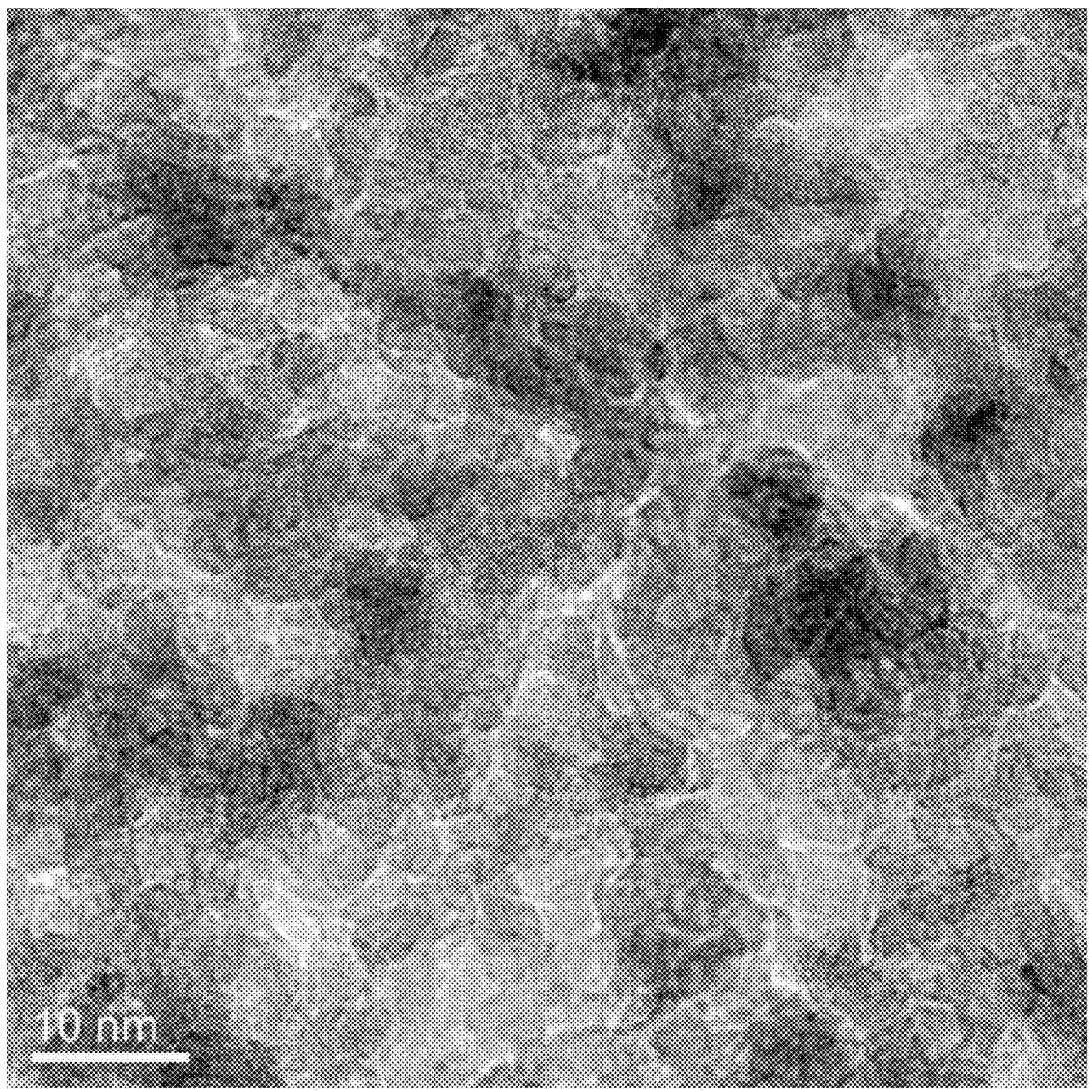
FIG. 4 shows a transmission electron microscope (TEM) image of an exemplary alumina coating formed by ECAP using a plasma torch operating at 800 W of power. A mix of amorphous and crystalline structure may be observed in the image.

Aluminum targets have been evaporated using microwave atmospheric pressure plasma jet in ECAP experiments. It has been demonstrated that aluminum oxide can be successfully coated onto 304 stainless steel substrates using a helium and nitrogen gas mix and an atmospheric pressure microwave plasma. Preferably, a high purity aluminum target is employed to produce the desired aluminum oxide coating at a satisfactory rate. The film morphology is found to be porous under low power deposition but denser under higher power deposition conditions. δ phase and β phase alumina are found in a coating prepared at 800 W sample and β phase and α phase alumina are found in a coating prepared at 1500 W. The phase of the deposited alumina film is determined to vary according to changes in input microwave power, and more than one phase of alumina may be simultaneously formed in the alumina film, in the form of nanocrystals that may be identified using transmission electron microscopy (TEM), as shown for example in FIG. 4.

Figure 5A:
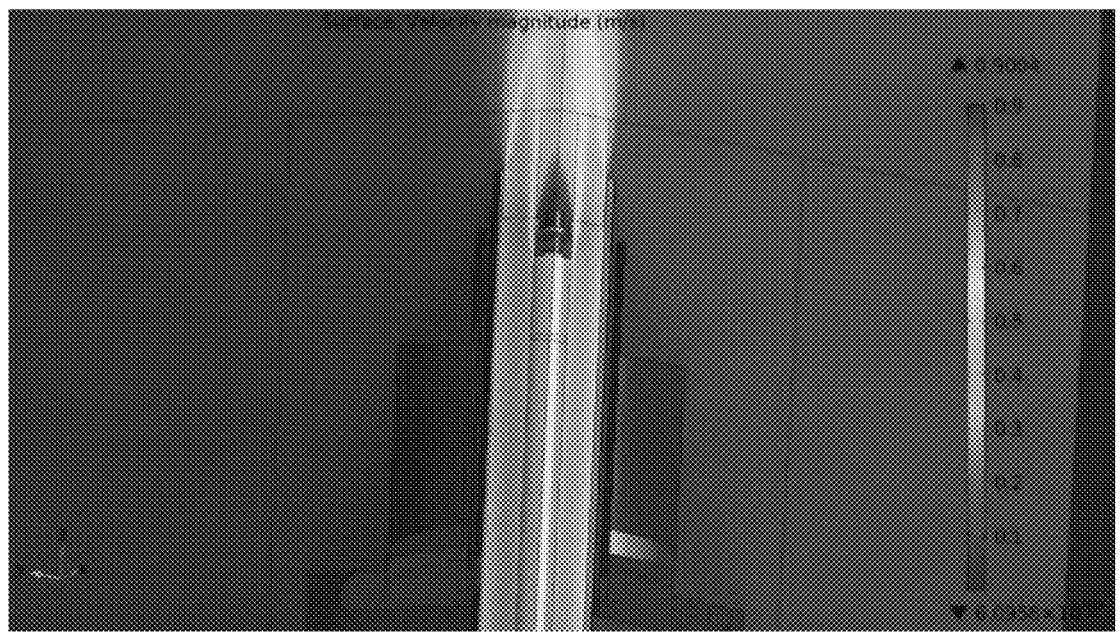
FIG. 5A shows a COMSOL simulation image for the gas flow profile inside an exemplary atmospheric pressure plasma jet.
Figure 5B:
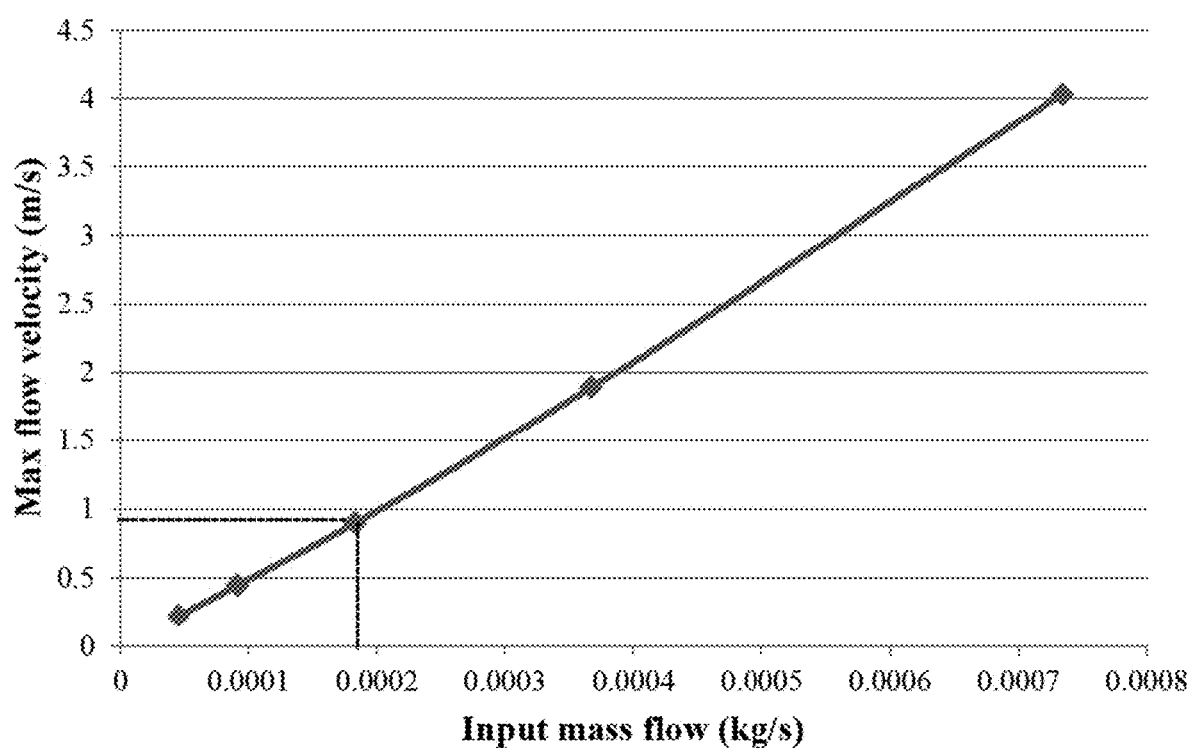
FIG. 5B shows gas flow velocity at the antenna tip according to the COMSOL simulations, where mass flow velocity is plotted as a function of input mass flow.
Figure 6:
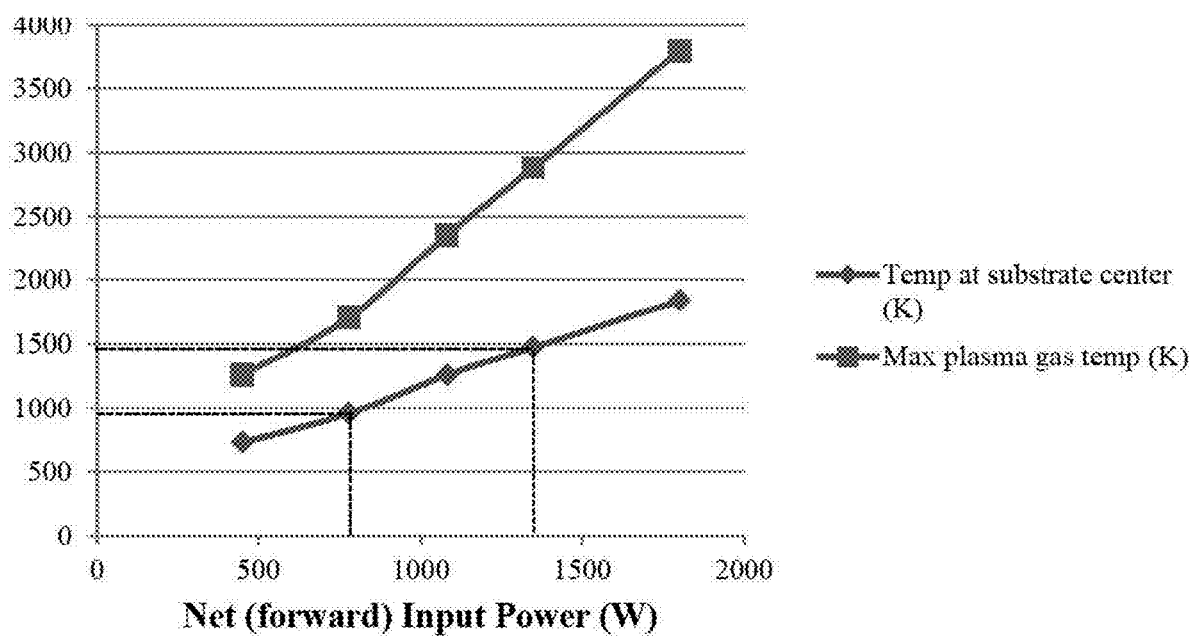
FIG. 6 shows predicted temperature at the substrate center and maximum plasma temperature according to the COMSOL simulations.

The plasma formed in ECAP is highly collisional and away from equilibrium. Also, the electron-neutral collision frequency is much greater than the plasma frequency at atmospheric pressure. Therefore, traditional characterization methods such as Langmuir probe diagnostics may not work for measuring electron temperature, electron density, or particle distribution of the plasma. Thus, to better understand the plasma and gas condition in the APPJ during operation, COMSOL finite element analysis simulation software is used to simulate the plasma gas temperature and the gas flow in the plasma region and inside the microwave torch during operation. The Reynolds number is calculated to be around 3000 and the flow inside the APPJ is found to be in turbulent regime. The standard turbulent flow kappa epsilon model is used to model this turbulent flow inside the APPJ, and the flow profile is found to peak around the antenna tip. FIG. 5A shows a COMSOL simulation image for the gas flow profile inside an exemplary atmospheric pressure plasma jet. The highest rate of flow (about 0.9 m/s) is located at the area outside the tip of the antenna. Mass flow velocity is plotted as a function of input mass flow in FIG. 5B. By coupling the turbulent flow model and the RF microwave heating model, the dielectric heating inside the APPJ and thus the temperature profile may be simulated. Referring to FIG. 6, the temperature profile is found to be close to the boiling point of alumina at the target surface and below melting point of the 304 stainless steel at the substrate surface. The temperature profile also correctly predicts the different phases obtained for samples prepared with different input microwave power.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An apparatus for depositing a coating on a substrate at atmospheric pressure, the apparatus comprising:
  a plasma torch comprising:
    a microwave source coupled to an antenna disposed within a chamber, the antenna being a linear antenna, the chamber having an open end and comprising a gas inlet for flow of a gas over the antenna to generate a plasma jet; and
    an arc source comprising an internal electrode separated from an external electrode, the external electrode being in electrical contact with a first arc power input, and the internal electrode being in electrical contact with a second arc power input, the internal and external electrodes being tubular and extending linearly;
  the external electrode being in electrical contact with the antenna, and also functioning as the antenna, the antenna having a tip;
  a substrate positioned outside the open end of the chamber, and disposed a predetermined distance away from the tip of the antenna; and
  a target material, that is different from the gas, to be coated on the substrate disposed at the tip of the antenna.

2. The apparatus of claim 1, further comprising a discharge tube surrounding the antenna and defining a pathway for gas flow over the antenna.

3. The apparatus of claim 2, further comprising a cylindrical nozzle disposed radially outside the discharge tube to direct a flow of nonreactive gas into a region surrounding the plasma jet.

4. The apparatus of claim 1, wherein the antenna comprises a hollow core, and wherein the target material comprises a continuous feed to the tip of the antenna through the hollow core.

5. The apparatus of claim 1, wherein the predetermined distance between the substrate and the tip of the antenna is from about 0.8 mm to about 51 mm.

6. The apparatus of claim 1, wherein the chamber is grounded.

7. The apparatus of claim 1, wherein the target material includes one or more elements selected from the group consisting of: Al, Au, Sn, Ag, Ti, Fe, and Cr.

8. An apparatus for depositing a coating on a substrate at atmospheric pressure, the apparatus comprising: a plasma torch comprising:
  a microwave source coupled to an antenna disposed within a chamber, the antenna being a linear antenna, the chamber having an open end and comprising a gas inlet for flow of a gas over the antenna to generate a plasma jet, and the antenna comprising a hollow core;
  an arc source comprising an internal electrode separated from an external electrode, the external electrode being in electrical contact with a first arc power input, and the internal electrode being in electrical contact with a second arc power input, the internal and external electrodes being tubular and extending linearly;
  the external electrode being in electrical contact with the antenna, and also functioning as the antenna, the antenna having a tip;
  a substrate positioned outside the open end of the chamber, and disposed a predetermined distance away from the tip of the antenna; and
  a target material that is different from the gas, to be coated on the substrate disposed at the tip of the antenna, the target material comprising a continuous feed to the tip of the antenna through the hollow core.

9. The apparatus of claim 8, further comprising a discharge tube surrounding the antenna and defining a pathway for gas flow over the antenna.

10. The apparatus of claim 9, further comprising a cylindrical nozzle disposed radially outside the discharge tube to direct a flow of nonreactive gas into a region surrounding the plasma jet.

11. The apparatus of claim 8, wherein the chamber is grounded.

12. The apparatus of claim 8, wherein the target material includes one or more elements selected from the group consisting of: Al, Au, Sn, Ag, Ti, Fe, and Cr.

* * * * *